(12) United States Patent
Lee et al.

(10) Patent No.: US 8,114,691 B2
(45) Date of Patent: Feb. 14, 2012

(54) SEMICONDUCTOR LIGHT EMITTING DEVICE HAVING TEXTURED STRUCTURE AND METHOD OF MANUFACTURING THE SAME

(75) Inventors: Jeong-wook Lee, Yongin-si (KR); Youn-joon Sung, Yongin-si (KR); Ho-sun Paek, Suwon-si (KR)

(73) Assignee: Samsung LED Co., Ltd., Suwon, Gyunggi-do (KR)

( * ) Notice: Subject to any disclaimer, the term of this patent is extended or adjusted under 35 U.S.C. 154(b) by 130 days.

(21) Appl. No.: 12/630,880

(22) Filed: Dec. 4, 2009

(65) Prior Publication Data

US 2010/0081221 A1 Apr. 1, 2010

Related U.S. Application Data

(62) Division of application No. 11/293,273, filed on Dec. 5, 2005, now Pat. No. 7,655,959.

(30) Foreign Application Priority Data

Dec. 8, 2004 (KR) .......................... 10-2004-0103112

(51) Int. Cl.
*H01L 21/00* (2006.01)
(52) U.S. Cl. ................ 438/27; 438/39; 438/42; 438/44; 257/E33.001
(58) Field of Classification Search ............ 438/27, 438/34, 39, 41, 42, 44; 257/E33.001
See application file for complete search history.

(56) References Cited

U.S. PATENT DOCUMENTS

| | | | |
|---|---|---|---|
| 6,657,236 B1 * | 12/2003 | Thibeault et al. | ............... 257/98 |
| 6,777,871 B2 * | 8/2004 | Duggal et al. | ............... 313/506 |
| 6,781,160 B1 | 8/2004 | Tsai et al. | |
| 6,809,342 B2 | 10/2004 | Harada et al. | |
| 7,187,007 B2 | 3/2007 | Kim et al. | |
| 7,317,212 B2 | 1/2008 | Shin | |
| 2002/0070449 A1 | 6/2002 | Yagi et al. | |
| 2002/0080463 A1 | 6/2002 | Tonar et al. | |
| 2002/0139990 A1 | 10/2002 | Suehiro et al. | |
| 2002/0190263 A1 | 12/2002 | Hata et al. | |
| 2003/0020087 A1 | 1/2003 | Goto et al. | |
| 2003/0160256 A1 | 8/2003 | Durocher et al. | |

(Continued)

FOREIGN PATENT DOCUMENTS

EP 1 111 689 A2 6/2001

(Continued)

OTHER PUBLICATIONS

Office Action dated Dec. 31, 2010 in corresponding Chinese Patent Application No. 200710005377.6, and translation thereof, and filed in co-pending U.S. Appl. No. 12/407,361.

(Continued)

*Primary Examiner* — Michael Trinh
(74) *Attorney, Agent, or Firm* — Buchanan Ingersoll & Rooney PC

(57) ABSTRACT

A semiconductor light emitting diode having a textured structure and a method of manufacturing the same are provided. The semiconductor light emitting diode includes a first semiconductor layer formed into a textured structure, an intermediate layer formed between the textured structures of the patterned first semiconductor layer, and a second semiconductor layer, an active layer, and a third semiconductor layer sequentially formed on the first semiconductor layer and the intermediate layer.

12 Claims, 8 Drawing Sheets

U.S. PATENT DOCUMENTS

| | | | |
|---|---|---|---|
| 2003/0178702 | A1 | 9/2003 | Sawaki et al. |
| 2003/0209714 | A1 | 11/2003 | Taskar et al. |
| 2004/0067648 | A1* | 4/2004 | Morita et al. .............. 438/689 |
| 2004/0089869 | A1 | 5/2004 | Uemura |
| 2004/0142503 | A1 | 7/2004 | Lee et al. |
| 2004/0178415 | A1 | 9/2004 | Hsu et al. |
| 2004/0189184 | A1 | 9/2004 | Yasuda |
| 2005/0023967 | A1 | 2/2005 | Gotoh et al. |
| 2005/0040407 | A1 | 2/2005 | Kohda |
| 2005/0082562 | A1 | 4/2005 | Ou et al. |
| 2005/0110123 | A1 | 5/2005 | Waitl et al. |
| 2005/0139846 | A1 | 6/2005 | Park et al. |
| 2005/0145873 | A1* | 7/2005 | Pan et al. ................ 257/103 |
| 2006/0118800 | A1 | 6/2006 | Kim |
| 2006/0198162 | A1 | 9/2006 | Ishidu et al. |
| 2006/0220050 | A1 | 10/2006 | Higaki et al. |
| 2006/0278880 | A1 | 12/2006 | Lee et al. |
| 2007/0018181 | A1 | 1/2007 | Steen et al. |
| 2007/0145386 | A1 | 6/2007 | Lee et al. |
| 2009/0181484 | A1 | 7/2009 | Lee et al. |

FOREIGN PATENT DOCUMENTS

| | | |
|---|---|---|
| EP | 1 429 396 A1 | 6/2004 |
| JP | 09-199759 A | 7/1997 |
| JP | 2003-142414 A | 5/2003 |
| JP | 2004-006937 A | 1/2004 |
| JP | 2004-153089 A | 5/2004 |
| JP | 2004-335740 A | 11/2004 |
| KR | 2005-0037324 | 4/2005 |
| KR | 10 2005 0087584 A | 8/2005 |
| KR | 2005-0079279 A | 8/2005 |
| KR | 10 2005 0096509 A | 10/2005 |
| KR | 2008-0004314 A | 1/2006 |
| WO | WO 2004/057682 A1 | 7/2004 |
| WO | WO 2005/020338 A1 | 3/2005 |

OTHER PUBLICATIONS

Office Action issued in Korean Patent Application No. 10-2004-0101653, Apr. 23, 2008, KIPO, KR, and English translation thereof.

Office Action in CN 200710005377.6 dated Jul. 31, 2009, and an English Translation thereof.

Final Office Action dated Aug. 25, 2010 in co-pending U.S. Appl. No. 12/407,361.

Chinese Office Action dated Jul. 11, 2008 and English translation.

Korean Office Action dated Apr. 21, 2008 and English translation.

European Search Report dated Nov. 7, 2008.

Hao et al., "GaN Films and GaN-Based Light Emitting Diodes Grown on the Sapphire Substrates With High-Density Nano-Craters Formed In Situ Metalorganic Vapor Phase Epitaxial Reactor", Physica Status Solidi, Sep. 7, 2004, pp. 2397-2400, (c)1, No. 10, Wiley-VCH Verlag GmbH & Co. KGaA, Weinheim, Germany.

Office Action issued on May 17, 2011 in corresponding Japanese patent application No. 2005-355405.

* cited by examiner

SEMICONDUCTOR LIGHT EMITTING DEVICE HAVING TEXTURED STRUCTURE AND METHOD OF MANUFACTURING THE SAME

CROSS-REFERENCE TO RELATED PATENT APPLICATION

This application is a divisional of U.S. application Ser. No. 11/293,273, filed on Dec. 5, 2005, U.S. Pat. No. 7,655,959, issued on Feb. 2, 2010, which claims the benefit of Korean Patent Application No. 10-2004-0103112, filed on Dec. 8, 2004, in the Korean Intellectual Property Office, the entire disclosure of which are incorporated herein by reference.

BACKGROUND OF THE DISCLOSURE

1. Field of the Disclosure

The present disclosure relates to a semiconductor light emitting diode, and more particularly, to a semiconductor light emitting diode that improves light extraction efficiency using a textured structure and a method of manufacturing the same.

2. Description of the Related Art

A light emitting diode (LED) is a device used for converting electrical energy into infra red rays, visible light, or other light using the characteristics of a compound semiconductor. The light emitting diode is a type of electro luminescent (EL) device, and presently, the light emitting diodes that employ an III-V group compound semiconductor are being practically utilized.

The III-V group compound semiconductor is a direct transition semiconductor, and is widely used for LEDs or laser diodes (LDs) since it provides stable operation at a higher temperature than devices that use other semiconductors. The III-V group compound semiconductor is typically formed on a substrate formed of sapphire $Al_2O_3$ or SiC. To improve light emission efficiency, or light extraction efficiency, a variety of LED structures have been studied. Presently, a study is being carried out to improve the light extraction efficiency by forming a textured structure on a light extraction region of the LED.

Light is hindered at an interface of material layers having different refractive indexes according to the refractive index of each of the material layers. In the case of a flat interface, when the light passes from a semiconductor layer having a greater refractive index (n=2.5) into an air layer having a smaller refractive index (n=1), the light must enter the flat interface at less than a predetermined angle with respect to the normal. If the light enters at an angle greater than the predetermined angle, the light totally is internally reflected at the flat interface, thereby greatly reducing the light extraction efficiency. To avoid the total internal reflection of light, a method of incorporating a textured structure at the interface has been attempted.

FIGS. 1A and 1B are cross-sectional views illustrating a conventional light emitting diode having a textured structure. Referring to FIG. 1A, a p-GaN layer 102, an active layer 103, an n-GaN layer 104 are sequentially formed on a p-electrode 101, and an n-electrode 105 is formed on the n-GaN layer 104. When light generated by the active layer 103 is extracted upward through the n-GaN layer 104, to change the incidence angle of the light, a textured structure 106 is incorporated at an interface between the n-GaN layer 104 and the air layer.

Referring to FIG. 1B, an n-GaN layer 112 is formed on a sapphire substrate 111, and an n-AlGaN layer 113, an active layer 114, a p-AlGaN layer 115, a p-GaN layer 116, and a p-electrode 117 are sequentially formed on a region of the n-GaN layer 112. An n-electrode 118 is formed on a region of the n-GaN layer 112 where the n-AlGaN layer 113 is not formed. This is a flip-chip structure in which light generated by the active layer 114 is mainly extracted through the transparent sapphire substrate 111. Here, the light extraction efficiency is improved by forming a textured structure 120 on the surface of the sapphire substrate 111.

A conventional semiconductor light emitting diode incorporates the textured structure 120 to improve the light extraction efficiency. However, particularly as depicted in FIG. 1B, when the textured structure 120 is incorporated by patterning the sapphire substrate 111, the growth of a semiconductor layer with a uniform quality is difficult, because there is a great possibility of generating defects in the semiconductor layer due to unmatched crystal structure between the sapphire substrate 111 and the semiconductor layer formed on the sapphire substrate 111. As a result, the light extraction efficiency is reduced due to the internal crystal defects.

SUMMARY OF THE DISCLOSURE

The present invention may provide a semiconductor light emitting diode having a structure that can improve light extraction efficiency and reduce internal crystal defects of the semiconductor light emitting diode and a method of manufacturing the semiconductor light emitting diode.

According to an aspect of the present invention, there may be provided a semiconductor light emitting diode comprising: a first semiconductor layer formed to a textured structure; an intermediate layer formed between the textured structures of the patterned first semiconductor layer; and a second semiconductor layer, an active layer, and a third semiconductor layer sequentially formed on the first semiconductor layer and the intermediate layer.

The substrate may be a sapphire substrate.

The intermediate layer may be formed of a transparent insulating material or a transparent conductive material having a refractive index of 2.5 or less.

The intermediate layer may be formed of a transparent insulating material including at least one of $SiO_2$, $SiN_x$, $Al_2O_3$, HfO, $TiO_2$, or ZrO.

The intermediate layer may be formed of a transparent conductive material, such as ZnO or an In oxide that includes at least one additive selected from the group consisting of Mg, Ag, Zn, Sc, Hf, Zr, Te, Se, Ta, W, Nb, Cu, Si, Ni, Co, Mo, Cr, Mn, Hg, Pr, and La.

The first semiconductor layer, the second semiconductor layer, and the third semiconductor layer may be formed of GaN.

The first semiconductor layer and the intermediate layer may be formed on the sapphire substrate.

The semiconductor light emitting diode may further comprise a first electrode formed on the third semiconductor layer, and a second electrode formed on a region of the second semiconductor layer in which the active layer is not formed.

The width of the textured structure of the first semiconductor layer pattern may be gradually narrowed as it goes upward.

According to another aspect of the present invention, there is provided a method of manufacturing a semiconductor light emitting diode having a textured structure, the method comprising: forming a first semiconductor layer on a sapphire substrate; exposing a portion of the sapphire substrate while forming the textured structure by etching the first semiconductor layer; forming an intermediate layer on the exposed sapphire substrate between the textured structures of the first semiconductor layer; and sequentially forming a second semiconductor layer, an active layer, and a third semiconductor layer on the first semiconductor layer and the intermediate layer.

The exposing of a portion of the sapphire substrate while forming the textured structure by etching the first semiconductor layer may comprise: performing a first etching to form etch pits on the surface of the first semiconductor layer; and performing a second etching to expose the surface of the sapphire substrate by etching the etch pits of the first semiconductor layer.

The first etching may be performed using $H_3PO_4$ and the second etching may be performed using KOH.

The forming of an intermediate layer on the exposed sapphire substrate between the textured structures of the first semiconductor layer comprises: coating a optical transmittance material on the exposed sapphire substrate and the textured structure of the first semiconductor layer; and forming the intermediate layer by leveling the optical transmittance material to expose the surface of the first semiconductor layer.

The method may further comprise annealing after the optical transmittance material is coated on the exposed sapphire substrate and the textured structure of the first semiconductor layer.

The method may further comprise performing a third dry etching of the exposed surface of the sapphire substrate.

BRIEF DESCRIPTION OF THE DRAWINGS

The above and other features and advantages of the present invention will be described in greater detail in exemplary embodiments thereof with reference to the attached drawings in which.

DETAILED DESCRIPTION OF EXEMPLARY EMBODIMENTS

The present invention will now be described more fully with reference to the accompanying drawings in which exemplary embodiments of the invention are shown.

Figure 1A:
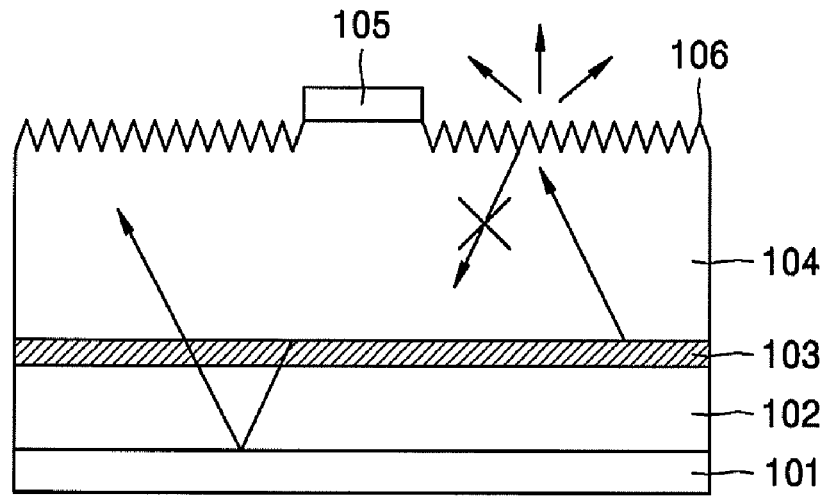
FIGS. 1A and 1B are cross-sectional views of conventional semiconductor light emitting diodes having a textured structure.
Figure 1B:
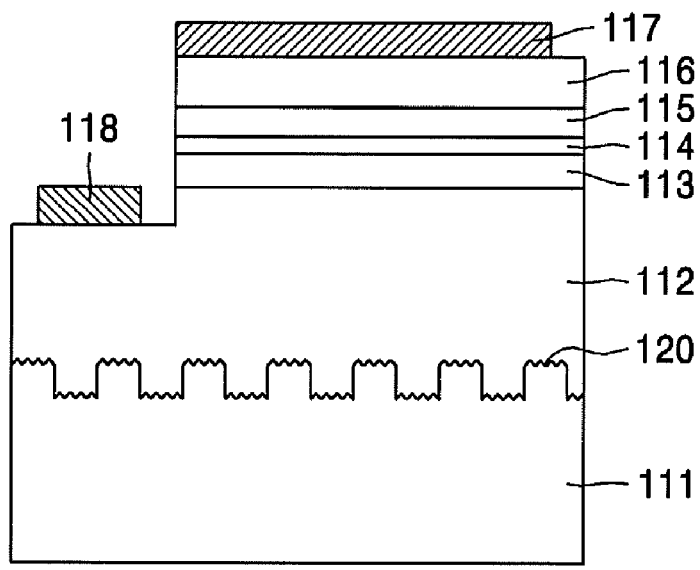
Figure 2:
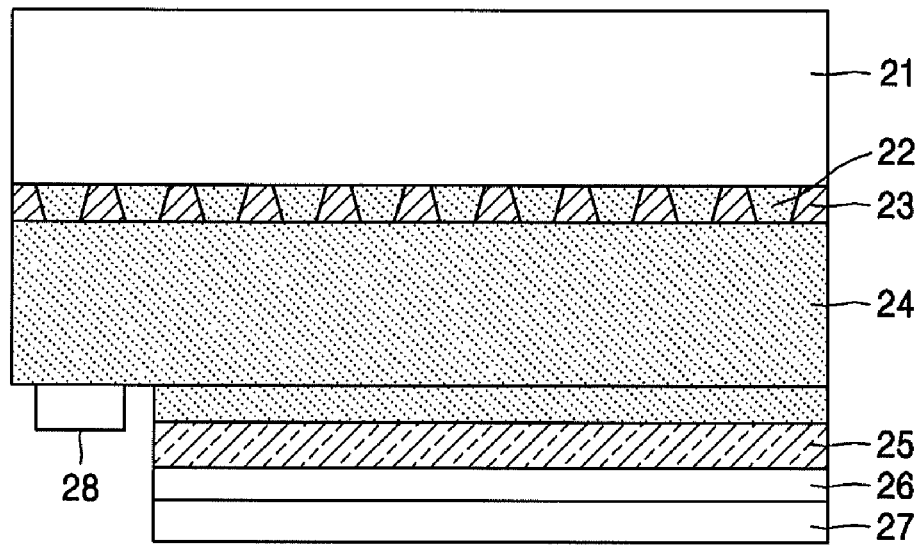
FIGS. 2 and 3 are cross-sectional views of semiconductor light emitting diodes having a textured structure according to the present invention.
Figure 3:
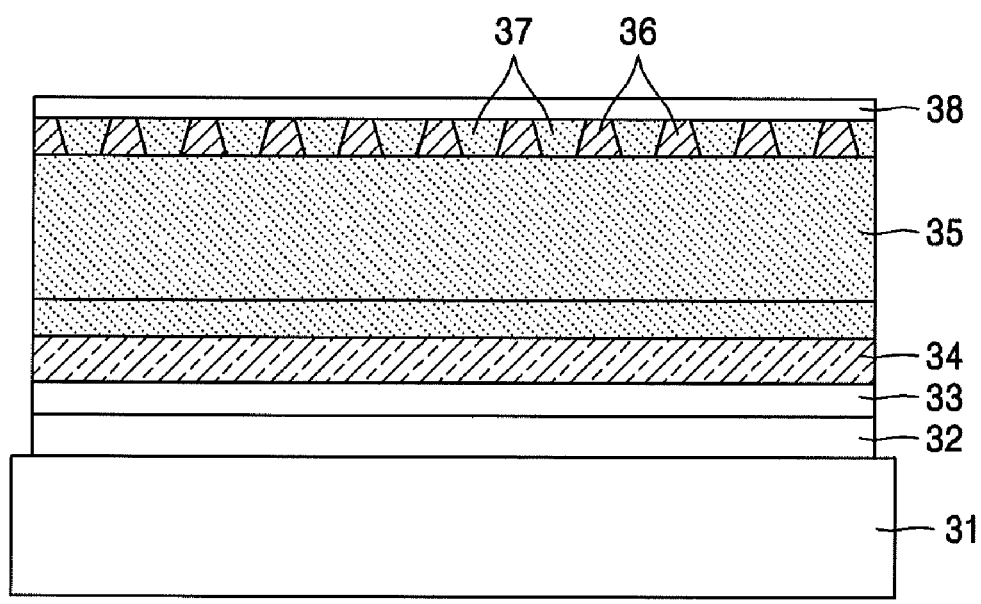

FIGS. 2 and 3 are cross-sectional views of semiconductor light emitting diodes having a textured structure according to the present invention.

FIG. 2 shows a textured structure applied to flip-chip type semiconductor light emitting diodes and FIG. 3 shows a textured structure applied to vertical type semiconductor light emitting diodes.

Referring to FIG. 2, a first semiconductor layer 22 and an intermediate layer 23 are formed in a textured structure on a transparent substrate 21, and a second semiconductor layer 24 is formed on the first semiconductor layer 22 and the intermediate layer 23. An active layer 25, a third semiconductor layer 26 and a first electrode 27 are sequentially formed on a first region of the second semiconductor layer 24. A second electrode 28 is formed on a second region of the second semiconductor layer 24.

The materials used for forming the layers are described hereafter. The transparent substrate 21 can be a widely used sapphire $Al_2O_3$ substrate, and the first semiconductor layer 22 and the second semiconductor layer 24 can be formed of p-GaN. The intermediate layer 23 may be formed of a transparent insulating material or a transparent conductive material having a refractive index of 2.5 or less. For example, the transparent insulating material can be $SiO_2$, $SiN_x$, $Al_2O_3$, HfO, $TiO_2$, or ZrO, and the transparent conductive material can be ZnO or an In oxide that includes at least one additive selected from the group consisting of Mg, Ag, Zn, Sc, Hf, Zr, Te, Se, Ta, W, Nb, Cu, Si, Ni, Co, Mo, Cr, Mn, Hg, Pr, and La. Here, it is seen that the intermediate layer 23 is formed of a transparent material. The active layer 25 can be formed of a material typically used for forming a semiconductor light emitting diode or a laser emitting diode in a multi-layer structure of a multi-quantum well barrier structure. The third semiconductor layer 26 can be formed of p-GaN, and, at this time, the first electrode 27 is formed of a p-type conductive material and the second electrode 28 is formed of an n-type conductive material.

As shown in FIG. 2, in the textured structure according to an embodiment of the present invention, the intermediate layer 23 is formed within a region where the first semiconductor layer 22 is patterned into the textured structure. Here, the distance between the pattered textured structures of the first semiconductor layer 22 is not uniform, but is determined according to crystal defects in the first semiconductor layer 22, particularly to screw dislocation which will be described later with reference to a subsequent manufacturing process. According to the semiconductor light emitting diode having the above structure, the intermediate layer 23 is formed in the crystal defect region of the first semiconductor layer 22, and the internal crystal defects can be reduced by forming the second semiconductor layer 24 on the first semiconductor layer 22. Accordingly, the extraction efficiency of light generated by the active layer 25 can be increased by incorporating the textured structure.

FIG. 3 is a cross-sectional view of a vertical type semiconductor light emitting diode having a textured structure according to an embodiment of the present invention. Referring to FIG. 3, a first electrode 32, a third semiconductor layer 33, an active layer 34, and a second semiconductor layer 35 are sequentially formed on a lower structure 31. A first semiconductor layer 37 patterned into a textured structure layer and an intermediate layer 36 are formed on the second semiconductor layer 35. Also, a second electrode 38 is formed on the first semiconductor layer and the intermediate layer 36.

The materials for forming each of the layers that constitute the vertical type semiconductor light emitting diode are as follows. The first semiconductor layer 37 and the second semiconductor layer 35 can be formed of p-GaN. The intermediate layer 36 may be formed of a transparent insulating material or a transparent conductive material having a refractive index of 2.5 or less. For example, the transparent insulating material can be $SiO_2$, $SiN_x$, $Al_2O_3$, HfO, $TiO_2$, or ZrO, and the transparent conductive material can be ZnO or an In oxide that includes at least one additive selected from the group consisting of Mg, Ag, Zn, Sc, Hf, Zr, Te, Se, Ta, W, Nb, Cu, Si, Ni, Co, Mo, Cr, Mn, Hg, Pr, and La. The active layer 34 can be formed of a material typically used for forming a semiconductor light emitting diode or a laser emitting diode in a multi-layer structure of a multi-quantum well barrier structure. The third semiconductor layer 33 can be formed of p-GaN, and, at this time, the first electrode 32 is formed of a p-type conductive material and the second electrode 38 is formed of an n-type conductive material.

As shown in FIG. 3, in the textured structure according to an embodiment of the present invention, the intermediate layer 36 is formed within a region where the first semiconductor layer 37 is patterned into the textured structure. Here, the distance between the patterned textured structures of the first semiconductor layer 37 is not uniform, but is determined according to crystal defects in the first semiconductor layer 37, particularly, to screw dislocation. According to the semiconductor light emitting diode having the above structure, the intermediate layer 36 is formed in the crystal defect region of the first semiconductor layer 37, and the internal crystal defects can be reduced by forming the second semiconductor layer 35 on the first semiconductor layer 37. Accordingly, the extraction efficiency of light generated by the active layer 33 can be increased by incorporating the textured structure.

A method of manufacturing a semiconductor light emitting diode having a textured structure according to an embodiment of the present invention will now be described with reference to FIGS. 4A through 4E.

Figure 4A:
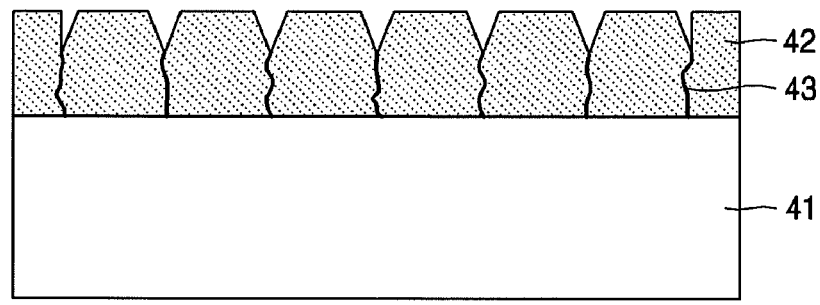
FIGS. 4A through 4E are cross-sectional views for illustrating a method of manufacturing a semiconductor light emitting diode according to an embodiment of the present invention.
Figure 6A:
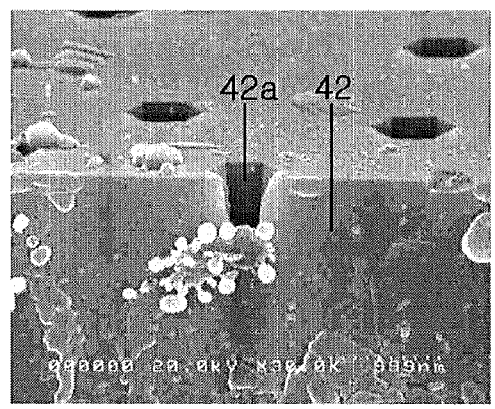
FIGS. 6A through 6D are SEM images of the semiconductor light emitting diode according to an embodiment of the present invention.

Referring to FIG. 4A, a first semiconductor layer 42 is formed on a substrate 41. Here, the substrate 41 is a sapphire substrate having a refractive index of 1.78, and the first semiconductor layer 42 is formed of n-GaN. After the first semiconductor layer 42 is applied, a first etching process for etching the surface of the first semiconductor layer 42 is performed using $H_3PO_4$. Here, internal crystal defects may be generated since the sapphire has a different crystal structure than GaN. Particularly, internal crystal defects which grow vertically from the sapphire substrate 41 toward the first semiconductor layer 42, such as screw dislocation 43, can be formed. When the surface of the first semiconductor layer 42 is wet etched using $H_3PO_4$, etch pits are formed at screw dislocation 43 regions since the etching occurs mainly at the screw. The wet etching progresses downward in the direction of the screw dislocations 43 and in the lateral directions as well. FIG. 6A is a SEM image of the first semiconductor layer 42 after the wet etching process as depicted in FIG. 4A with respect to the first semiconductor layer 42 is performed using $H_3PO_4$.

Figure 4B:
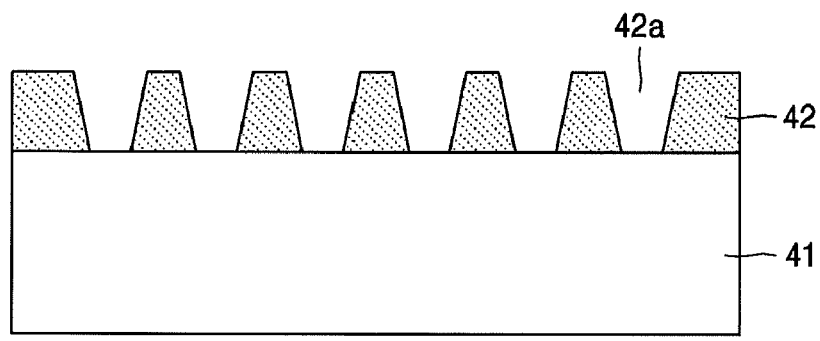
Figure 6B:
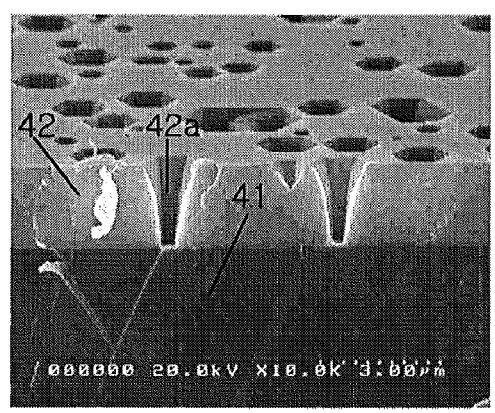

Referring to FIG. 4B, a second etching is performed with respect to the first semiconductor layer 42 using KOH. When the second etching is performed using KOH, the etching progresses vertically downward along the screw dislocations 43 of the first semiconductor layer 42. The etching direction of the first semiconductor layer 42 by KOH is vertically downward unlike that obtained by the use of $H_3PO_4$. Consequently, the surface of the sapphire substrate 41 is exposed, and the cross-section of the first semiconductor layer 42 becomes a textured structure patterned into a trapezoidal shape. Reference numeral 42a represents a region etched by $H_3PO_4$ and KOH. FIG. 6B is a SEM image for showing the result of etching the first semiconductor layer 42. Referring to FIG. 6B, the cross-section of the first semiconductor layer 42 has a trapezoidal shape, that is a textured structure, as a result of etching the first semiconductor layer 42 using KOH until the surface of the sapphire substrate 41 is exposed.

Figure 4C:
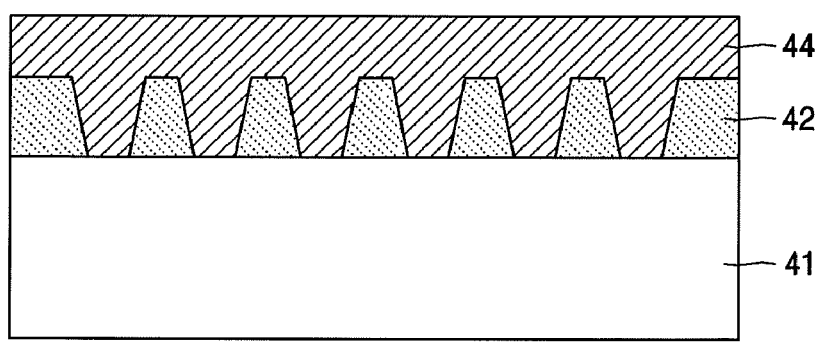
Figure 6C:
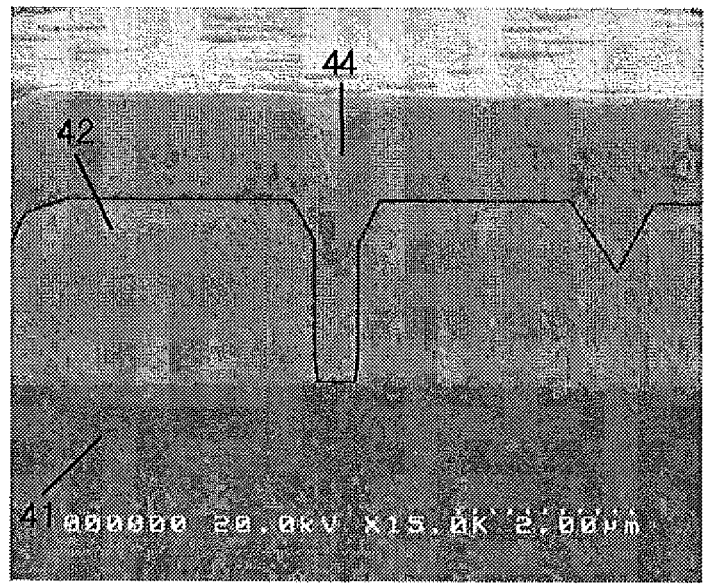

Referring to FIG. 4C, an intermediate layer 44 is formed on the first semiconductor layer 42 patterned into a textured structure on the sapphire substrate 41. The intermediate layer 44 may be formed of a material having a high light transmittance since light emitted by an active layer is extracted to the outside through the textured structure. The intermediate layer 44 may be formed of a transparent insulating material or a transparent conductive material having a refractive index of 2.5 or less. For example, the transparent insulating material can be $SiO_2$, $SiN_x$, $Al_2O_3$, HfO, $TiO_2$, or ZrO, and the transparent conductive material can be ZnO or an In oxide that includes at least one additive selected from the group consisting of Mg, Ag, Zn, Sc, Hf, Zr, Te, Se, Ta, W, Nb, Cu, Si, Ni, Co, Mo, Cr, Mn, Hg, Pr, and La. These materials have refractive indexes in the range of approximately 1.4 to 1.8. FIG. 6C is a SEM image of the intermediate layer 44 formed on the first semiconductor layer 42 patterned into the textured structure. The intermediate layer 44 is formed in the etched region of the first semiconductor layer 42 as well as on the first semiconductor layer 42. After the intermediate layer 44 is applied, an annealing process can further be performed. A MOCVD process an be performed at 1100° C. for approximately 1 hour under a $H_2$ atmosphere.

Figure 4D:
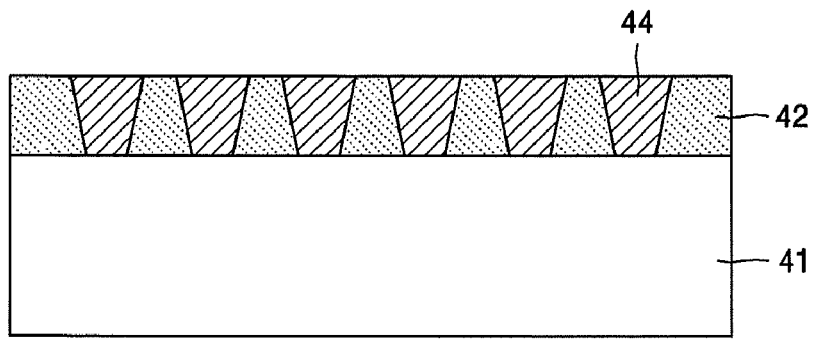

Referring to FIG. 4D, to expose the upper part of the first semiconductor layer 42 patterned into the textured structure, a leveling process is performed to remove the upper part of the intermediate layer 44. Accordingly, the intermediate layer 44 remains only between the textured structures of the first semiconductor layer 42.

Figure 4E:
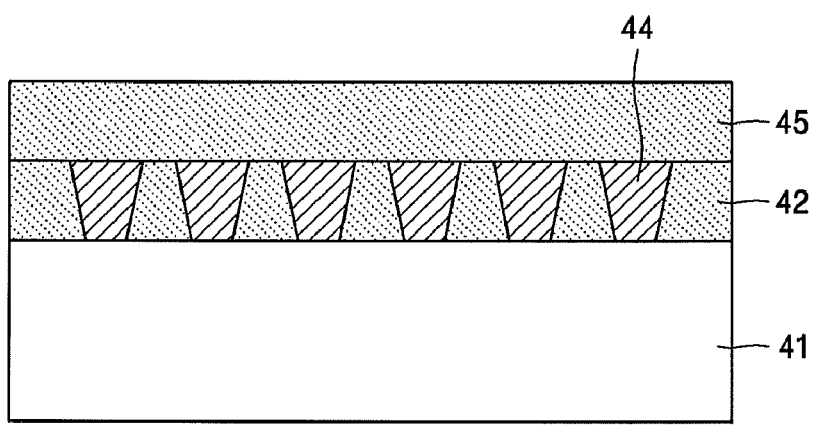

Referring to FIG. 4E, a second semiconductor layer 45 is formed on the exposed first semiconductor layer 42 and the remaining intermediate layer 44. The second semiconductor layer 45 may be formed of the same material as the first semiconductor layer 42, such as n-GaN. In this case, since the second semiconductor layer 45 is grown on the first semiconductor layer 42 which has fewer crystal defects than the sapphire substrate 41, the crystal defects in the second semiconductor layer 45 are greatly reduced compared to the instance when the second semiconductor layer 45 is grown directly on the sapphire substrate 41.

The textured structure according to an embodiment of the present invention can be formed in a semiconductor light emitting diode by the processes described with reference to FIGS. 4A through 4E. An active layer and a third semiconductor layer formed on the second semiconductor layer 45 can be readily formed using a conventional process. The textured structure can be used as a flip-chip structure, or as a vertical structure after the sapphire substrate 41 is removed and electrodes are further formed.

The textured structure formed in the semiconductor light emitting diode using the processes described above, unlike in the conventional art, not only improves the light extraction efficiency but also reduces crystal defects, thereby allowing stable operation and extending the lifetime of the device.

A semiconductor light emitting diode having a textured structure according to another embodiment of the present invention will now be described with reference to FIGS. 5A through 5E.

Figure 5A:
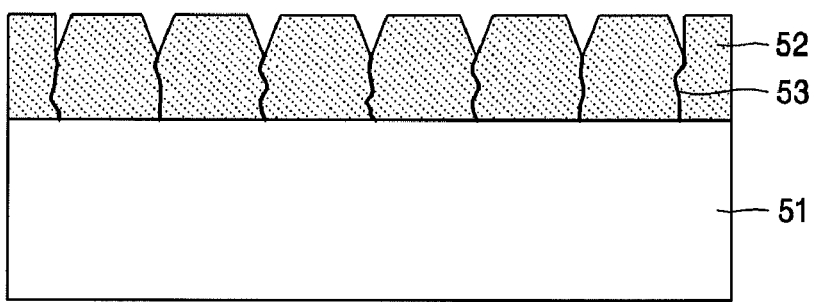
FIGS. 5A through 5E are cross-sectional views for illustrating a method of manufacturing a semiconductor light emitting diode according to another embodiment of the present invention.

Referring to FIG. 5A, a first semiconductor layer 52 is formed on a substrate 51. Here, the substrate 51 is a sapphire substrate, and the first semiconductor layer 52 is formed of n-GaN. After the first semiconductor layer 52 is applied, a first etching process is performed using $H_3PO_4$ to etch the surface of the first semiconductor layer 52. This forms etch pits at screw dislocation 43 regions, since the etching occurs mainly at the screw dislocation 43 regions. The wet etching progresses downward in the direction of the screw dislocations 43, and in the lateral directions as well.

Figure 5B:
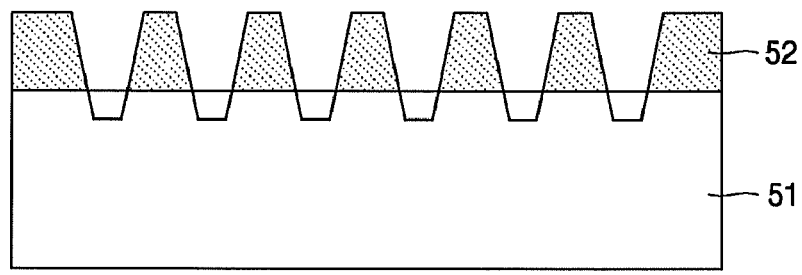
Figure 6D:
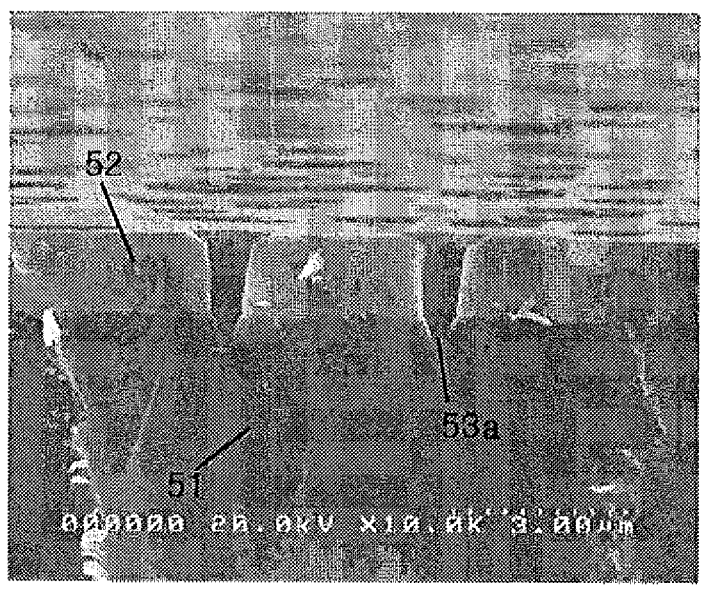

Referring to FIG. 5B, a second etching is performed on the first semiconductor layer 52 using KOH. This etches vertically downward along the screw dislocations 43 of the first semiconductor layer 52. The etching direction of the first semiconductor layer 52 by KOH is vertically downward, unlike that obtained by the use of $H_3PO_4$. Consequently, the surface of the sapphire substrate 51 is exposed, and the cross-section of the first semiconductor layer 52 becomes a textured structure patterned into a trapezoidal shape. Reference numeral 52a represents a region etched by $H_3PO_4$ and KOH. At this time, after etching the first semiconductor layer 52 by KOH, etching is performed on a region of the substrate 51 exposed by the dry etching. Accordingly, grooves are formed by etching the exposed regions of the substrate 51. FIG. 6D is a SEM image of the substrate 51 obtained dry etching after the etching of the first semiconductor layer 52 using KOH.

Figure 5C:
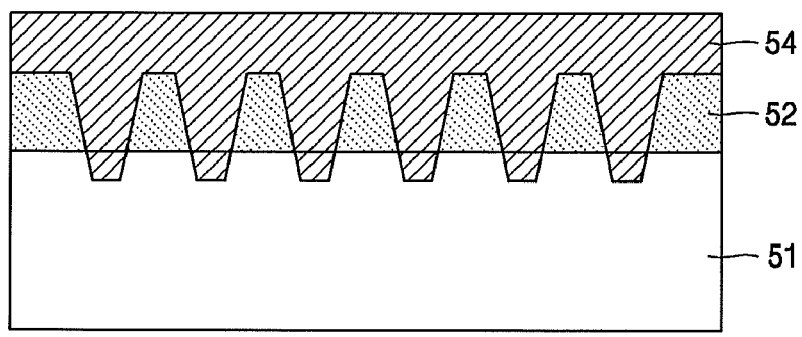

Referring to FIG. 5C, an intermediate layer 54 is formed on the first semiconductor layer 52 patterned into a textured structure on the sapphire substrate 51. The intermediate layer 54 may be formed of a transparent insulating material or a transparent conductive material having high light transmittance and a refractive index of 2.5 or less, since light emitted by an active layer is extracted to the outside through the textured structure. The transparent insulating material can be $SiO_2$, $SiN_x$, $Al_2O_3$, HfO, $TiO_2$, or ZrO, and the transparent conductive material can be ZnO or an In oxide that includes at least one additive selected from the group consisting of Mg, Ag, Zn, Sc, Hf, Zr, Te, Se, Ta, W, Nb, Cu, Si, Ni, Co, Mo, Cr, Mn, Hg, Pr, and La. After the intermediate layer 54 is coated, an annealing process can further be performed. The annealing can be performed at approximately 1100° C. for approximately 1 hour under a $H_2$ atmosphere.

Figure 5D:
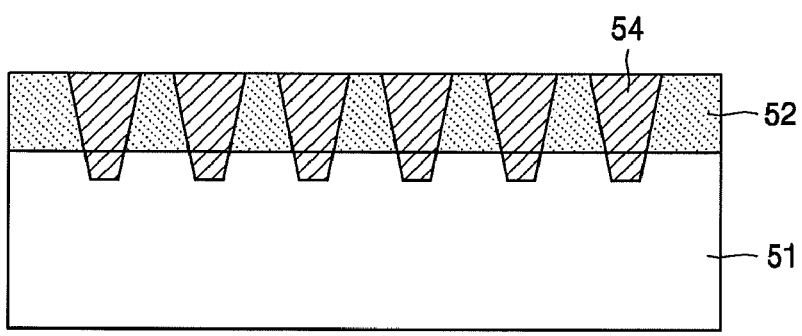

Next, referring to FIG. 5D, to expose the upper part of the first semiconductor layer 52 patterned into the textured structure, a leveling process is performed to remove the upper part of the intermediate layer 54. Accordingly, the intermediate layer 54 remains only between the textured structures of the first semiconductor layer 52.

Figure 5E:
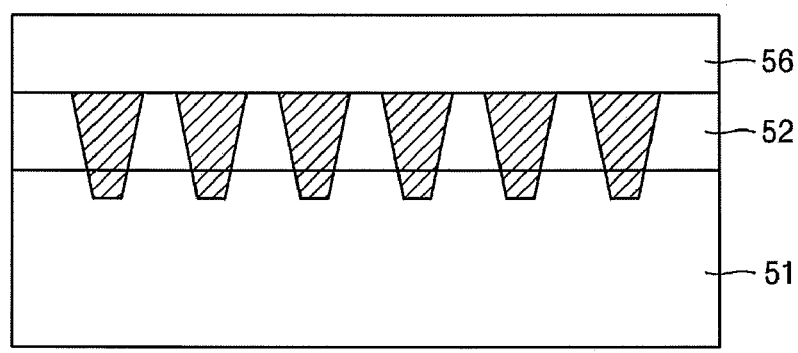

Referring to FIG. 5E, a second semiconductor layer 56 is formed on the exposed first semiconductor layer 52 and the remaining intermediate layer 54. The second semiconductor layer 56 may be formed of the same material as the first semiconductor layer 52, such as n-GaN. In this case, since the second semiconductor layer 56 is grown on the first semiconductor layer 52 which has fewer crystal defects than the sapphire substrate 51, the crystal defects in the second semiconductor layer 56 are greatly reduced compared to the instance when the second semiconductor layer 56 is grown directly on the sapphire substrate 51. An active layer and a third semiconductor layer formed on the second semiconductor layer 56 can be readily formed using a conventional process.

Figure 7:
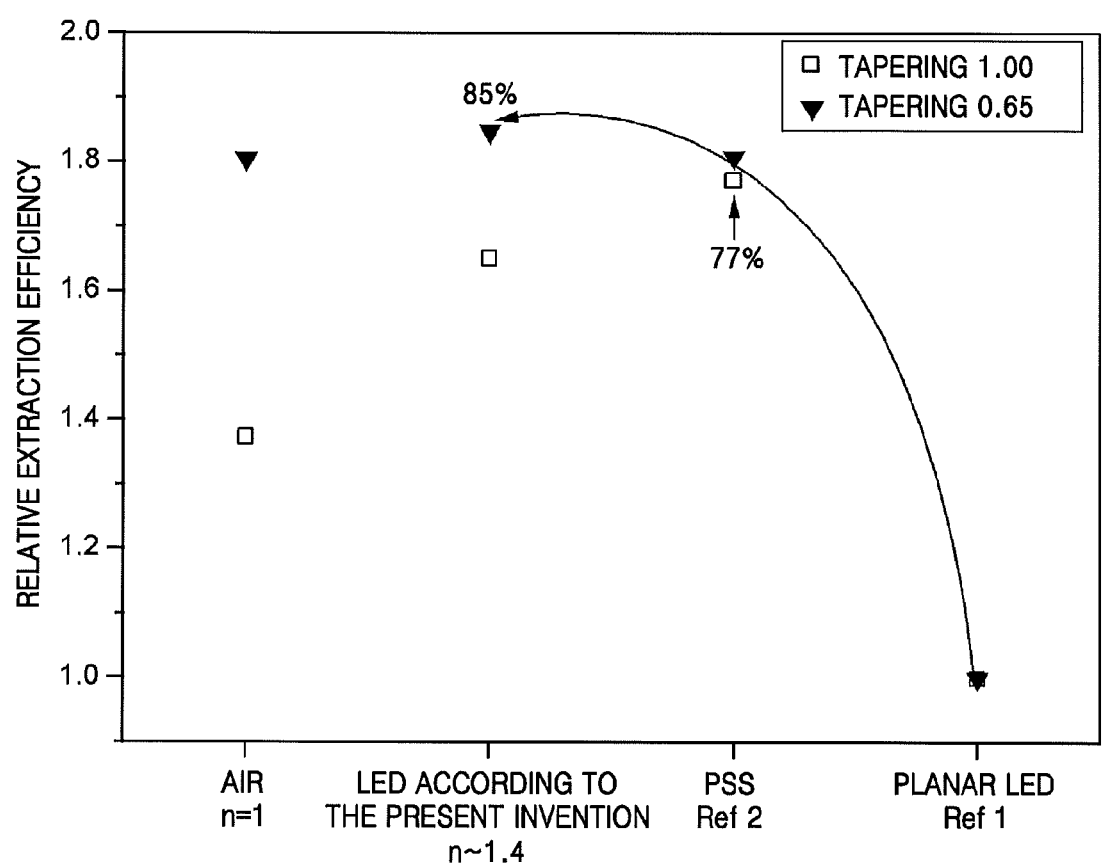
FIG. 7 is a graph showing the light extraction efficiencies of a conventional semiconductor light emitting diode having a textured structure and a semiconductor light emitting diode having a textured structure according to an embodiment of the present invention.

FIG. 7 is a graph showing the light extraction efficiencies of a conventional semiconductor light emitting diode having a textured structure and a semiconductor light emitting diode having a textured structure according to an embodiment of the present invention.

Referring to FIGS. 2 and 3, the textured structure of the first semiconductor layer 22 has a hexagonal trapezoidal shape or a hexagonal cylindrical shape, or an inverse of these shapes. Patterns are prepared, each with a diameter of 1 μm, and a height of 0.5 μm, and with the distance between the patterns being 1 μm, and the light extraction efficiency of the patterns is investigated. The results show that the semiconductor light emitting diode having the textured structure (dielectric embedded nitride structure, n=1.4) according to an embodiment of the present embodiment has a maximum of 85% higher light extraction efficiency than a conventional planar structure semiconductor light emitting diode, and a maximum of 77% higher light extraction efficiency than a semiconductor light emitting diode Ref 2 having a conventional trapezoidal textured structure (patterned sapphire substrate (PSS), n=1.78).

While the present invention has been particularly shown and described with reference to exemplary embodiments thereof, it will be understood by those of ordinary skill in the art that various changes in form and detail may be made therein without departing from the spirit and scope of the present invention as defined by the following claims.

According to the present invention, the extraction efficiency of light emitted by an active layer can be greatly improved, and the crystal defects in the semiconductor device can be reduced, by forming a textured structure pattern in a semiconductor layer of a semiconductor light emitting diode, thereby enabling stable operation and increasing the lifespan of the semiconductor light emitting diode.

What is claimed is:

1. A method of manufacturing a semiconductor light emitting diode having a textured structure, the method comprising:
    forming a first semiconductor layer on a substrate;
    forming the textured structure having a plurality of holes on the first semiconductor layer in defect regions by etching the first semiconductor layer, each hole exposing a portion of the substrate;
    forming an intermediate layer on the exposed portions of the substrate between the textured structures of the first semiconductor layer by filling the plurality of holes with light-transmissive material; and
    sequentially forming a second semiconductor layer, an active layer, and a third semiconductor layer on the first semiconductor layer and the intermediate layer,
    wherein the first semiconductor layer has an upper surface that is substantially coplanar with the light transmissive material of the intermediate layer.

2. The method of claim 1, wherein the step of forming the textured structure by etching the first semiconductor layer comprises:
    performing a first etching to form etch pits on the surface of the first semiconductor layer; and
    performing a second etching to expose the surface of the substrate by etching the etch pits of the first semiconductor layer.

3. The method of claim 2, wherein the first etching is performed using $H_3PO_4$ and the second etching is performed using KOH.

4. The method of claim 1, wherein the forming of an intermediate layer on the exposed portions of the substrate between the textured structures of the first semiconductor layer comprises:
    coating a transparent material on the exposed substrate between the textured structures of the first semiconductor layer; and
    forming the intermediate layer by leveling the transparent material to expose the surface of the first semiconductor layer.

5. The method of claim 4, wherein the intermediate layer is formed of a transparent insulating material including at least one of $SiO_2$, $SiN_x$, $Al_2O_3$, HfO, $TiO_2$, or ZrO.

6. The method of claim 1, wherein the intermediate layer is formed of a transparent conductive material including at least one oxide of a Zn oxide and an In oxide that includes at least one additive selected from the group consisting of Mg, Ag, Zn, Sc, Hf, Zr, Te, Se, Ta, W, Nb, Cu, Si, Ni, Co, Mo, Cr, Mn, Hg, Pr, and La.

7. The method of claim 4, further comprising annealing after the transparent material is coated on the exposed substrate between the textured structures of the first semiconductor layer.

8. The method of claim 2, further comprising performing a third dry etching the exposed surface of the substrate.

9. The method of claim 1, the substrate comprises a sapphire substrate.

10. A method of manufacturing a semiconductor light emitting diode having a textured structure, the method comprising:

forming a first semiconductor layer on a sapphire substrate;

exposing a portion of the sapphire substrate while forming the textured structure by etching the first semiconductor layer;

forming an intermediate layer on the exposed substrate between the textured structures of the first semiconductor layer; and sequentially forming a second semiconductor layer, an active layer, and a third semiconductor layer on the first semiconductor layer and the intermediate layer, wherein the step of exposing a portion of the sapphire substrate comprises:

performing a first etching to form etch pits on a surface of the first semiconductor layer; and performing a second etching to expose a surface of the substrate by etching the etch pits of the first semiconductor layer.

11. The method of claim 10, wherein the first etching is performed using $H_3PO_4$ and the second etching is performed using KOH.

12. The method of claim 10, further comprising performing a third dry etching on the exposed portion of the substrate.

* * * * *